United States Patent [19]

Kayanuma

[11] 4,114,180
[45] Sep. 12, 1978

[54] CLOSED LOOP LASER NOISE ELIMINATION FOR OPTOELECTRONIC RECORDING

[75] Inventor: Kanji Kayanuma, Yokohama, Japan

[73] Assignee: Victor Company of Japan, Limited, Yokohama, Japan

[21] Appl. No.: 832,890

[22] Filed: Sep. 13, 1977

[30] Foreign Application Priority Data

Sep. 14, 1976 [JP] Japan ................................ 51-110057

[51] Int. Cl.$^2$ .......................... G11B 7/00; H03F 1/28; H03F 1/30
[52] U.S. Cl. ............................ 358/128; 179/100.3 N; 179/100.3 GN; 179/100.3 V; 250/205; 331/94.5 S; 346/76 L; 346/108; 365/206
[58] Field of Search ............. 358/128; 179/100.3 GN, 179/100.3 N, 100.3 V, 100.3 M, 100.3 P; 350/169; 346/76 L, 108; 365/206; 250/205, 578; 331/94.5 S, 94.5 T, 109, 183; 360/24

[56] References Cited

U.S. PATENT DOCUMENTS

| | | | |
|---|---|---|---|
| 3,720,453 | 3/1973 | Lee et al. ......................... | 365/206 X |
| 3,780,296 | 12/1973 | Waksberg et al. ............... | 331/94.5 S |
| 3,787,887 | 1/1974 | Burton ................................ | 346/108 |
| 3,903,360 | 9/1975 | Kamisaka et al. ............... | 365/206 X |
| 4,051,329 | 9/1977 | Blondet et al. ............... | 179/100.3 N |

Primary Examiner—Bernard Konick
Assistant Examiner—Donald McElheny
Attorney, Agent, or Firm—Fleit & Jacobson

[57] ABSTRACT

In an optoelectronic audio/video recording system wherein a laser beam which is subject to undesired broad-spectrum noise is intensity modulated by a light modulator with an audio/video intelligence signal, a feedback control loop is provided including a half-silvered mirror disposed in the path of the beam to transmit a greater part of the light energy to the light modulator and to reflect some of the light to a photoelectrical transducer to convert the reflected light into corresponding electrical signal, a plurality of filter-amplifier circuits for dividing the frequency spectrum of the signal into a plurality of separate frequency bands to provide outputs accentuated such that each output has a particular amplitude versus frequency characteristic corresponding to a portion of the noise spectrum, and a second light modulator disposed in the path of the beam incident to the half-silvered mirror to effect the intensity modulation of the beam with the outputs from the separate filter-amplifiers to suppress the undesired broad-spectrum noise, to an acceptable level.

7 Claims, 4 Drawing Figures

CLOSED LOOP LASER NOISE ELIMINATION FOR OPTOELECTRONIC RECORDING

BACKGROUND OF THE INVENTION

The present invention relates generally to optoelectronic recording systems utilizing an intensity-modulated laser beam, and in particular to such a system in which the intrinsic laser noise and intensity fluctuation are minimized by a closed loop control.

Optoelectronic disc recording involves the use of a laser and electrooptical light modulating devices for modulating the intensity of the laser beam in accordance with a modulating signal. However, the laser beam is replete with noise and fluctuation in intensity due to the fluctuation of the level of energy used to pump the laser source and other influencing factors. Such noise and fluctuation are found to exist over a broad range of frequencies.

SUMMARY OF THE INVENTION

The primary object of the invention is to provide an optoelectronic recording system in which undesired broad-spectrum noise present in a laser beam is reduced by intensity modulating the laser beam with a feedback correction signal derived from a closed control loop prior to the intensity modulation of the beam with an audio/video intelligence signal.

According to the present invention, a feedback control loop is provided in an optoelectronic recording system wherein a laser beam is intensity modulated with an intelligence signal by means of a first light modulator, which control loop includes a half-silvered mirror disposed in the path of the laser beam prior to the intensity modulation by the intelligence signal, a photoelectrical transducer adapted to convert the energy of the beam reflected from the half-silvered mirror into a corresponding electrical signal, and a plurality of filter-amplifier circuits for dividing the frequency spectrum of the signal from the transducer into a plurality of separate frequency bands such that the amplitude versus frequency characteristic of each frequency band corresponds to that of a portion of the intensity distribution in the noise spectrum of the laser beam. A second light modulator is disposed in the path of the laser beam between the laser source and the half-silvered mirror for intensity modulating the beam with the signals of the separate bandwidths. The feedback control loop has respective loop gains for separate bandwidths which gains are determined in relation to the cutoff frequencies of the respective bandwidths of the loop and which cutoff frequencies are determined in relation to the delay time existing in the respective bandwidths of the control loop.

A voltage clamp circuit is preferably included in the control loop to maintain the maximum and minimum voltages of the feedback control signal within a prescribed range in order to prevent the control signal from exceeding the normal operating range of the light modulator even when its operating characteristic varies with the amount of heat accumulated therein during operation.

BRIEF DESCRIPTION OF THE DRAWINGS

These and other objects, features and advantages of the present invention will be understood from the following description taken in conjunction with the accompanying drawings, in which.

DESCRIPTION OF THE PREFERRED EMBODIMENTS

Figure 1:
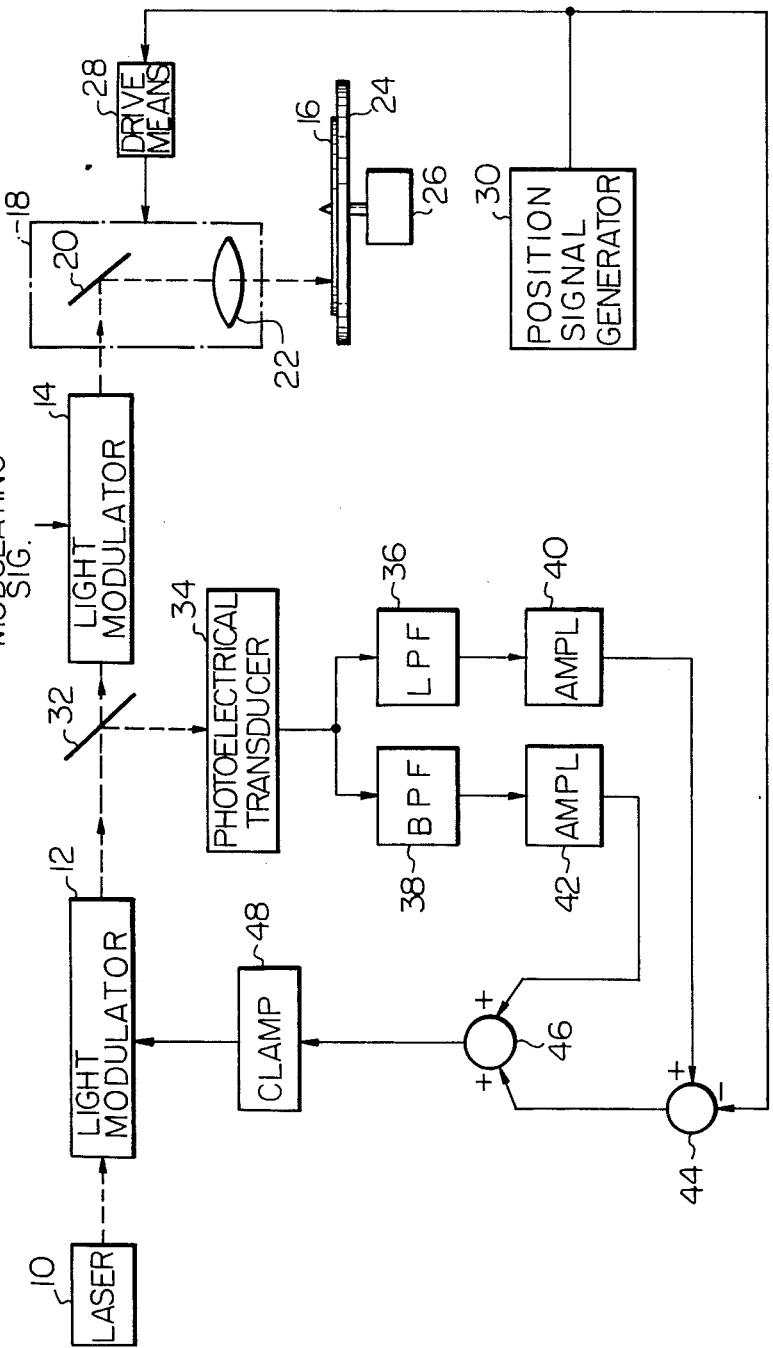
FIG. 1 is a circuit block diagram of an embodiment of the invention.

Referring now to FIG. 1 of the drawings, a laser source 10 emits a laser beam toward a first light modulator 14 where the light is modulated in intensity by a modulating signal. The modulated laser beam is directed to the surface of a light sensitive recording disc 16 by means of an optical unit 18 including a reflector 20 and a lens system 22. The recording disc 16 is mounted on a turntable 24 which is driven by a motor 26. A drive means 28 is provided to receive position control signal representing the radial distance from the circumference of the recording disc from a position signal generator 30 to drive the optical unit 18 radially inwardly in relation to the turning speed of the motor so that the focusing point follows a convolution.

In the path of the light between light modulator 14 and the laser source 10 is disposed a second light modulator 12 and a half-silvered mirror 32 which transmits most of the incident light to the modulator 14 and reflects a small fraction of the light to a photoelectrical transducer 34 where the reflected light energy is translated into a corresponding electrical signal. Since the laser beam contains noise and fluctuations over a broad range of spectrum as exemplarily indicated by curve I of FIG. 3, the output from the photoelectrical transducer 34 is an electrical representation of such noise and fluctuations. A lowpass filter 36 having a cutoff frequency at $f_1$ and a bandpass filter 38 having cutoff frequencies at $f_4$ and $f_5$ are provided to frequency-divide the output from the transducer. The outputs from filters 36 and 38 are respectively amplified by amplifiers 40 and 42 to required signal levels. The output signal from amplifier 40 is applied to a subtractor 44 where the signal is combined with an output from the position signal generator 30. Since the output from the amplifier 40 contains DC component whose magnitude may vary in response to the fluctuation of the laser beam intensity, radial compensation is achieved by subtracting a voltage representing the radial position of the focusing point from the output of amplifier 40 so that the light energy consumed per unit area of the recording disc may be held at a constant value. The output from amplifier 42 is applied to a summing junction or adder 46 where it is combined with a signal from the subtractor 44.

The combined signal from the adder 46 is fed to a voltage clamping circuit 48 where the maximum and minimum voltages of the input signal are clamped at predetermined maximum and minimum levels, respectively. The light modulator 12 is fed with the output from the clamping circuit 48 to modulate the intensity of the passing light beam in a direction to eliminate the broad-spectrum noise intrinsically present in the laser beam.

Figure 3:
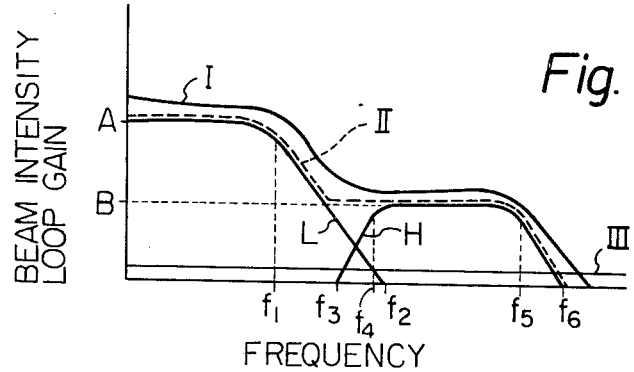
FIG. 3 is a graphic representation of an exemplary intensity distribution of the laser noise and fluctuation over the frequency spectrum and the loop gains of separate bandwidths as a function of frequency.

It is noted that two closed loops are formed for high and low frequency components and each closed loop has a respective maximum loop gain and accentuation in the respective frequency range. As illustrated in FIG. 3, the low frequency closed loop is accentuated so that its maximum gain A is greater than the maximum loop gain B of the high frequency closed loop, and the combined frequency response characteristic of the loops as indicated by curve II conforms substantially to curve I so that the noise and fluctuation level of the output beam from the light modulator 12 may be reduced to an acceptable level as indicated by line III of FIG. 3.

In order to provide stability in the closed control loops, the loop for the low frequency components should have a delay time $T_L$ which is greater than $\frac{1}{f_2}$ where $f_2$ is a frequency in the noise spectrum at which the loop gain falls to unity, and the cutoff frequency $f_1$ be equal to $f_2/A$. Similarly, the loop for the high frequency components should have a delay time $T_H$ which is greater than $\frac{1}{f_6}$ where $f_6$ is a frequency in the noise spectrum at which the loop gain falls to unity, and the cutoff frequency $f_5$ be equal to $f_6/B$. Since cutoff frequencies $f_4$ and $f_5$ are determined by the noise characteristic in the higher frequency range, frequency $f_3$ at which the high-frequency loop gain falls to unity is also determined by $f_3 = f_4/B$.

It is probable that the noise characteristic may vary between laser sources employed, the frequency response characteristic of the respective loops must be determined for the particular laser source in such manner as to conform to the respective portions of the frequency response in the noise spectrum so that the noise components present in the resultant beam is reduced to the acceptable level.

Figure 4:
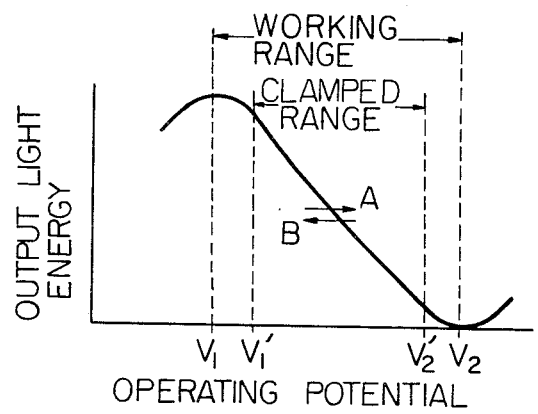
FIG. 4 is a graphic representation of the operating characteristic of a light modulating device employed in the practice of the invention illustrating the limited range of the control signal in relation to the normal operating range of the device.

The light modulator 12 comprises a body of electro-optical element which exhibits an operating characteristic as shown in FIG. 4. As indicated, the energy level of the light transmitted through the light modulator decreases inversely with the increase in voltage applied thereto for a certain range of applied voltages from $V_1$ to $V_2$. However, the electrooptical element is responsive also to the heat generated therein by shifting its operating curve in the directions as indicated by the arrows A and B.

The limiter 48 functions to restrict the minimum and maximum levels of the voltage applied to the light modulator 12 in a range between $V_1'$ slightly greater than $V_1$ and $V_2'$ slightly smaller than $V_2$ so that even when the light modulator is subject to the amount of heat generated the operating voltage falls within the working range of the light modulator between voltages $V_1$ and $V_2$.

Figure 2:
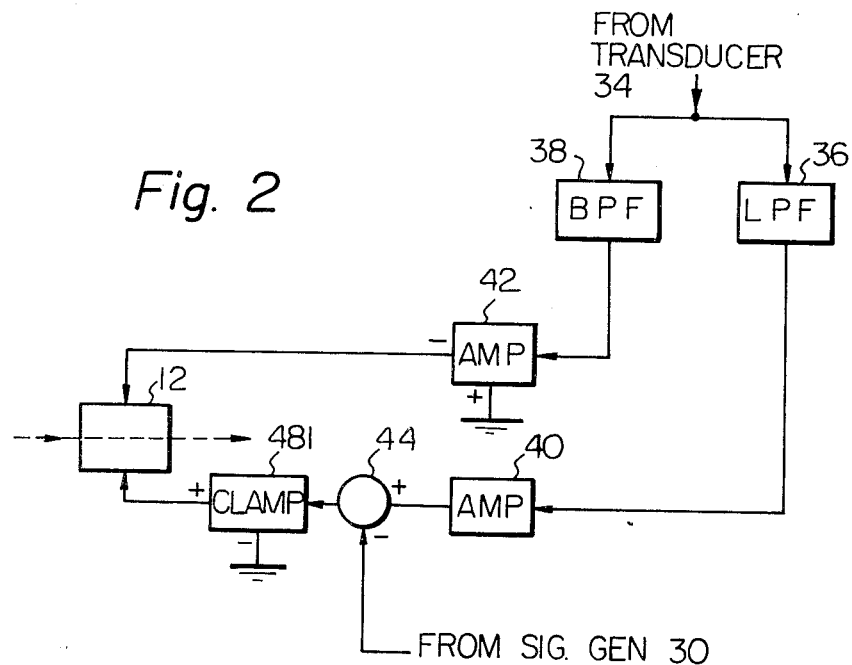
FIG. 2 is a modification of the embodiment of FIG. 1.

An alternative circuit arrangement is shown in FIG. 2 in which the adder 46 of the previous embodiment is dispensed with and a negative polarity output from the amplifier 42 is directly coupled to one terminal of the light modulator 12 instead of being connected to the adder 46 and the output from the subtractor 44 is directly coupled to a limiter 48 instead of being connected to the adder 46. The limiter 48 provides a signal of positive polarity to the other terminal of the light modulator so that the modulator is fed with signals of opposite polarities, and as a result the voltage across the terminals of the modulator 12 is a summation of the two signals.

What is claimed is:

1. A recording system including a light modulator receptive in use of a laser beam for modulating the intensity thereof in accordance with an intelligence signal and means for sequentially subjecting a selected portion of a light sensitive recording medium to the intensity modulated laser beam, wherein said laser beam is subject to broad-spectrum noise, comprising:
   a photoelectrical transducer;
   means disposed in the path of said beam for directing a portion of the beam incident to said light modulator to said photoelectrical transducer;
   means for dividing the frequency spectrum of the output from said transducer into a plurality of separate frequency bands and accentuating the signal of each of said separate frequency bands such that each of said bands has an amplitude versus frequency characteristic which substantially conforms to a portion of the frequency response characteristic of said broad-spectrum noise of said laser beam incident to said photoelectrical transducer; and
   a second light modulator disposed in the path of said laser beam incident to said beam directing means for modulating the intensity thereof in accordance with said accentuated signals, whereby a feedback control loop is formed for each of said divided frequency bands,
   the signal in each of said divided frequency bands being accentuated such that each feedback control loop has a maximum loop gain which suppresses the noise of the corresponding portion of the noise spectrum to an acceptable level.

2. A recording system as claimed in claim 1, wherein said second light modulator is of the type having a predetermined range of acceptable input signal levels, further comprising means for limiting the minimum and maximum levels of said amplified signals within a range which is smaller than said predetermined range of said second light modulator.

3. A recording system as claimed in claim 1, wherein said dividing means comprises a plurality of filters each and plurality of amplifying means associated with the respective filter means, wherein the cutoff frequency of each of said filters is determined in relation to a delay time which is present in a respective loop circuit comprised of said beam directing means, said transducer, the associated filter and amplifying means and said second light modulator and in relation to the maximum gain of said respective loop circuit.

4. A recording system as claimed in claim 1, wherein said recording medium is a disc mounted on a turntable for rotation therewith, further comprising means for driving said turntable, an optical unit for focusing said laser beam leaving the first-mentioned light modulator to the surface of said recording disc, means for deriving information as to the position of said focused laser beam on said disc with respect to a reference point, means for driving said optical unit in accordance with said derived information, and means for applying said derived information to said second light modulator.

5. A recording system as claimed in claim 4, wherein said frequency dividing means includes a lowpass filter operable to pass electrical signals including direct current signals, and wherein said signal applying means comprises means for subtractively combining the output from the signal through said lowpass filter and a signal representative of said derived information, the output from said subtractor being applied to said second light modulator.

6. A recording system as claimed in claim 1, further comprising means for additively combining said amplified signals of different bandwidths prior to the application of said signals to said second light modulator.

7. A recording system as claimed in claim 6, wherein said second light modulator includes a pair of electrodes and wherein said additively combining means includes a series circuit through which said amplified signals are applied to said pair of electrodes in opposite polarities to one another.

* * * * *